(12) United States Patent
Kim

(10) Patent No.: US 6,475,863 B1
(45) Date of Patent: Nov. 5, 2002

(54) METHOD FOR FABRICATING SELF-ALIGNED GATE OF FLASH MEMORY CELL

(75) Inventor: Hyeon-Seag Kim, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/150,556

(22) Filed: May 17, 2002

(51) Int. Cl.$^7$ .......................................... H01L 21/8247
(52) U.S. Cl. ...................................... 438/264; 438/594
(58) Field of Search ................................ 438/257, 258, 438/259, 264, 594, 595

(56) References Cited

U.S. PATENT DOCUMENTS

| | | | |
|---|---|---|---|
| 6,184,083 B1 * | 2/2001 | Tsunashima et al. | 438/258 |
| 6,251,729 B1 * | 6/2001 | Montree et al. | 438/257 |
| 6,333,223 B1 * | 12/2001 | Moriwaki et al. | 438/258 |
| 6,429,072 B1 * | 8/2002 | Tsukiji | 438/257 |

* cited by examiner

*Primary Examiner*—Chandra Chaudhari
(74) *Attorney, Agent, or Firm*—Monica H. Choi

(57) ABSTRACT

For fabricating a flash memory cell, a dummy gate structure is formed on an active device area of a semiconductor substrate. A drain bit line junction is formed within the active device area of the semiconductor substrate to a first side of the dummy gate structure, and a source bit line junction is formed within the active device area of the semiconductor substrate to a second side of the dummy gate structure. A drain bit line silicide is formed within the drain bit line junction, and a source bit line silicide is formed within the source bit line junction. Furthermore, an interlevel material is formed to surround the dummy gate structure, and the dummy gate structure is then etched away to form a gate opening within the interlevel material. Spacers are then formed at sidewalls of the gate opening within the gate opening. After formation of the spacers, a tunnel dielectric structure is formed at a bottom wall of the gate opening, and a floating gate structure is formed on the tunnel dielectric structure within the gate opening. In addition, a floating dielectric structure is formed on the floating gate structure within the gate opening, and a control gate structure is formed on the floating dielectric structure within the gate opening. In this manner, a self-aligned gate structure is formed to be comprised of the tunnel dielectric structure, the floating gate structure, the floating dielectric structure, and the control gate structure between the spacers within the gate opening.

21 Claims, 8 Drawing Sheets

US 6,475,863 B1

METHOD FOR FABRICATING SELF-ALIGNED GATE OF FLASH MEMORY CELL

TECHNICAL FIELD

The present invention relates generally to flash memory technology, and more particularly, to a method for fabricating a self-aligned flash memory cell with dimensions that are beyond photolithography limitations and with minimized bit line to bit line leakage current and with maximized area of drain and source bit line silicides.

BACKGROUND OF THE INVENTION

Referring to FIG. 1, a flash memory cell 100 of a flash memory device includes a tunnel dielectric structure 102 typically comprised of silicon dioxide ($SiO_2$) as known to one of ordinary skill in the art of integrated circuit fabrication. The tunnel dielectric structure 102 is disposed on a semiconductor substrate or a p-well 103. In addition, a floating gate structure 104, comprised of a conductive material such as polysilicon for example, is disposed over the tunnel dielectric structure 102. A floating dielectric structure 106, typically comprised of silicon dioxide ($SiO_2$), is disposed over the floating gate structure 104. A control gate structure 108, comprised of a conductive material, is disposed over the floating dielectric structure 106.

A drain bit line junction 110 that is doped with a bit line dopant, such as arsenic (As) or phosphorous (P) for example, is formed within an active device area 112 of the semiconductor substrate or p-well 103 toward a left sidewall of the tunnel dielectric structure 102 in FIG. 1. A source bit line junction 114 that is doped with the bit line dopant is formed within the active device area 112 of the semiconductor substrate or p-well 103 toward a right sidewall of the tunnel dielectric structure 102 of FIG. 1.

During the program or erase operations of the flash memory cell 100 of FIG. 1, charge carriers are injected into or tunneled out of the floating gate structure 104. Such variation of the amount of charge carriers within the floating gate structure 104 alters the threshold voltage of the flash memory cell 100, as known to one of ordinary skill in the art of flash memory technology. For example, when electrons are the charge carriers that are injected into the floating gate structure 104, the threshold voltage increases. Alternatively, when electrons are the charge carriers that are tunneled out of the floating gate structure 104, the threshold voltage decreases. These two conditions are used as the two states for storing digital information within the flash memory cell 100, as known to one of ordinary skill in the art of electronics.

During programming of the flash memory cell 100 for example, a voltage of +9 Volts is applied on the control gate structure 108, a voltage of +5 Volts is applied on the drain bit line junction 110, and a voltage of 0 Volts is applied on the source bit line junction 114 and on the semiconductor substrate or p-well 103. With such bias, when the flash memory cell 100 is an N-channel flash memory cell, electrons are injected into the floating gate structure 104 to increase the threshold voltage of the flash memory cell 100 during programming of the flash memory cell 100.

Alternatively, during erasing of the flash memory cell 100, a voltage of −9.5 Volts is applied on the control gate structure 108, the drain bit line is floated at junction 110, and a voltage of +4.5 Volts is applied on the source bit line junction 114 and on the semiconductor substrate or p-well 103 for example. With such bias, when the flash memory cell 100 is an N-channel flash memory cell, electrons are pulled out of the floating gate structure 104 to decrease the threshold voltage of the flash memory cell 100 during erasing of the flash memory cell 100. Such an erase operation is referred to as an edge erase process by one of ordinary skill in the art of flash memory technology.

In an alternative channel erase process, a voltage of −9.5 Volts is applied on the control gate structure 108 and a voltage of +9 Volts is applied on the semiconductor substrate or p-well 103 with the drain and source bit line junctions 110 and 114 floating. With such bias, when the flash memory cell 100 is an N-channel flash memory cell, electrons are pulled out of the floating gate structure 104 to the substrate or p-well 103 to decrease the threshold voltage of the flash memory cell 100 during erasing of the flash memory cell 100.

The tunnel dielectric structure 102, the floating gate structure 104, the floating dielectric structure 106, and the control gate structure 108 comprise the gate structure of the flash memory cell 100. Such structures and operation of the flash memory cell 100, are known to one of ordinary skill in the art of flash memory technology.

Referring to FIG. 2, in the prior art, for forming the gate structure of the flash memory cell 100, a layer of tunnel dielectric material 122, comprised of silicon dioxide ($SiO_2$) for example, is deposited on the semiconductor substrate 103. In addition, a layer of floating gate material 124, comprised of polysilicon for example, is deposited on the layer of tunnel dielectric material 122, and a layer of floating dielectric material 126, comprised of silicon dioxide ($SiO_2$) for example, is deposited on the layer of floating gate material 124. Furthermore, a layer of control gate material 128, comprised of polysilicon for example, is deposited on the layer of floating dielectric material 126.

Referring to FIGS. 2 and 3, a photoresist structure 130 comprised of photoresist material is patterned on the layer of control gate material 128. Referring to FIG. 3, any portions of the layer of control gate material 128 not under the photoresist structure 130 is etched away to form the control gate structure 108 comprised of the control gate material remaining under the photoresist structure 130. Similarly, any portions of the layer of floating dielectric material 126 not under the photoresist structure 130 is etched away to form the floating dielectric structure 106 comprised of the floating dielectric material remaining under the photoresist structure 130. In addition, any portions of the layer of floating gate material 124 not under the photoresist structure 130 is etched away to form the floating gate structure 104 comprised of the floating gate material remaining under the photoresist structure 130. Furthermore, any portions of the layer of tunnel dielectric material 122 not under the photoresist structure 130 is etched away to form the tunnel dielectric structure 102 comprised of the tunnel dielectric material remaining under the photoresist structure 130.

Processes for deposition and patterning of the layer of tunnel dielectric material 122, the layer of floating gate material 124, the layer of floating dielectric material 126, and the layer of control gate material 128, with the photoresist structure 130 to form the gate structure comprised of the tunnel dielectric structure 102, the floating gate structure 104, the floating dielectric structure 106, and the control gate structure 108, are known to one of ordinary skill in the art of flash memory technology.

Referring to FIGS. 3 and 4, after such patterning of the gate structure comprised of the tunnel dielectric structure 102, the floating gate structure 104, the floating dielectric structure 106, and the control gate structure 108, the photoresist structure 130 is etched away. In addition, a bit line dopant, such as phosphorous or arsenic for an N-type dopant, is implanted into exposed regions of the active device area of the semiconductor wafer 103 to form the drain bit line junction 110 and the source bit line junction 114. Such an implantation process for formation of the drain and source bit line junctions 110 and 114 is known to one of ordinary skill in the art of flash memory technology.

Then, spacers 132, comprised of a dielectric material such as silicon dioxide ($SiO_2$) for example, are formed on the sidewalls of the gate structure of the flash memory cell. Then, a drain bit line silicide 134 is formed with an exposed region of the drain bit line junction 110 for providing low resistance contact to the drain bit line junction 110, and a source bit line silicide 136 is formed with an exposed region of the source bit line junction 114 for providing low resistance contact to the source bit line junction 114. Processes for formation of such spacers 132 and such drain and source bit line silicides 134 and 136 are known to one of ordinary skill in the art of flash memory technology.

With steps of fabrication of the flash memory cell illustrated in FIGS. 2, 3, 4, and 5, according to the prior art, the minimum length of the gate structure for defining the channel length 138 of the flash memory cell between the drain and source bit line junctions 110 and 114 is limited by photolithography limitations. However, such a channel length dimension is desired to be scaled down further for enhancing the speed performance of the flash memory cell. In addition, referring to FIG. 5, the area of the drain and source bit line silicides 134 and 136 is decreased by formation of the spacers 132 on the drain and source bit line junctions 110 and 114. However, a maximized area of the drain and source bit line silicides 134 and 136 is desired for minimizing parasitic resistance at the drain and source bit lines of the flash memory cell.

SUMMARY OF THE INVENTION

Accordingly, in a general aspect of the present invention, spacers and a self-aligned gate structure of a flash memory cell are formed within a gate opening for fabricating the flash memory cell with a channel length dimension that is beyond photolithography limitations and with minimized bit line to bit line leakage current and with maximized area of drain and source bit line silicides.

In a general aspect of the present invention, for fabricating a flash memory cell, a dummy gate structure is formed on an active device area of a semiconductor substrate. A drain bit line junction is formed within the active device area of the semiconductor substrate to a first side of the dummy gate structure, and a source bit line junction is formed within the active device area of the semiconductor substrate to a second side of the dummy gate structure. A drain bit line silicide is formed within the drain bit line junction, and a source bit line silicide is formed within the source bit line junction.

Furthermore, an interlevel material is formed to surround the dummy gate structure, and the dummy gate structure is then etched away to form a gate opening within the interlevel material. Spacers are then formed at sidewalls of the gate opening within the gate opening. After formation of the spacers, a tunnel dielectric structure is formed at a bottom wall of the gate opening, and a floating gate structure is formed on the tunnel dielectric structure within the gate opening. In addition, a floating dielectric structure is formed on the floating gate structure within the gate opening, and a control gate structure is formed on the floating dielectric structure within the gate opening.

In this manner, a self-aligned gate structure is formed to be comprised of the tunnel dielectric structure, the floating gate structure, the floating dielectric structure, and the control gate structure between the spacers within the gate opening. Additionally, because the drain and source bit line silicides are formed before formation of the spacers, the area of the drain and source bit line silicides is not limited by formation of the spacers to maximize the area of the drain and source bit line silicides. In addition, because the spacers are formed before the self-aligned gate structure, the channel length of the flash memory cell defined by the length of the self-aligned gate structure is further decreased by the width of the spacers such that the channel length of the flash memory cell may be reduced beyond that possible from photolithography limitations. Furthermore, because the drain and source bit line junctions are formed with the dummy gate structure that has a longer length than the length of the selfaligned gate structure, the distance between the drain and source bit line junctions is maximized to minimize the leakage current between the drain bit line junction and the source bit line junction.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1–24 refer to elements having similar structure and function.

DETAILED DESCRIPTION

Figure 6:
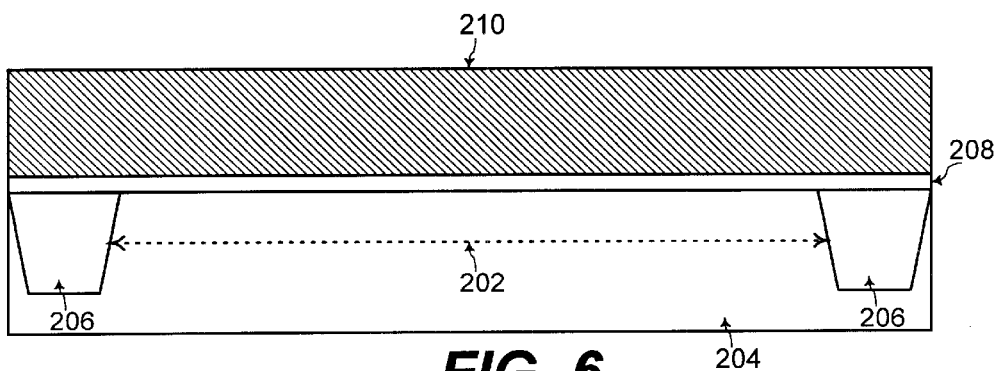
FIGS. 6–24 show cross-sectional views illustrating steps of fabrication of a flash memory cell, with dimensions that are beyond photolithography limitations and with minimized bit line to bit line leakage current and with maximized area of drain and source bit line silicides, according to an embodiment of the present invention.

Referring to FIG. 6, according to an embodiment of the present invention, a flash memory cell is fabricated on an active device area 202 of a semiconductor substrate 204 defined by shallow trench isolation structures 206. The semiconductor substrate 204 is comprised of silicon, and the shallow trench isolation structures 206 are comprised of silicon dioxide ($SiO_2$), according to one embodiment of the present invention. Processes for fabricating the shallow trench isolation structures 206 within the semiconductor substrate 204 are known to one of ordinary skill in the art of integrated circuit fabrication and flash memory technology.

Further referring to FIG. 6, for fabricating a flash memory cell according to an embodiment of the present invention, a layer of pad material 208 is deposited on the semiconductor substrate, and a layer of dummy gate material 210 is deposited on the layer of pad material 208. When the semiconductor substrate is comprised of silicon, the layer of pad material 208 is comprised of silicon dioxide ($SiO_2$), and the layer of dummy gate material 210 is comprised of silicon nitride (SiN), according to one embodiment of the present invention. Processes for deposition of such a layer of pad material 208 and such a layer of dummy gate material 210 are known to one of ordinary skill in the art of integrated circuit fabrication and flash memory technology.

Figure 7:
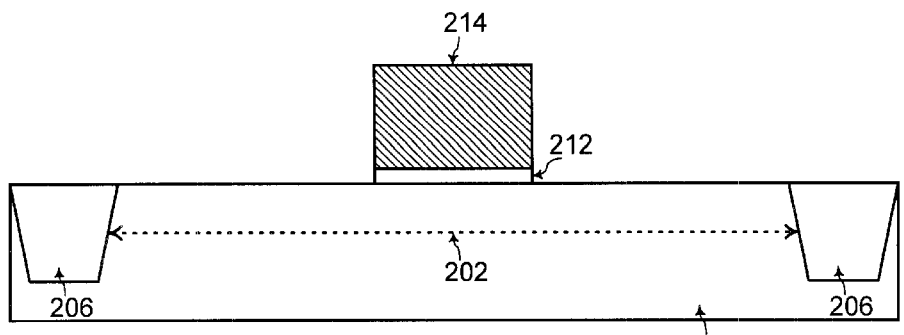

Referring to FIGS. 6 and 7, the layer of pad material 208 and the layer of dummy gate material 210 are patterned to form a pad gate structure 212 and a dummy gate structure 214, respectively. The pad gate structure 212 and the dummy gate structure 214 are formed to be within the active device area 202. Processes for patterning the layer of pad material 208 and the layer of dummy gate material 210 to form the pad gate structure 212 and the dummy gate structure 214 are known to one of ordinary skill in the art of integrated circuit fabrication and flash memory technology.

Figure 8:
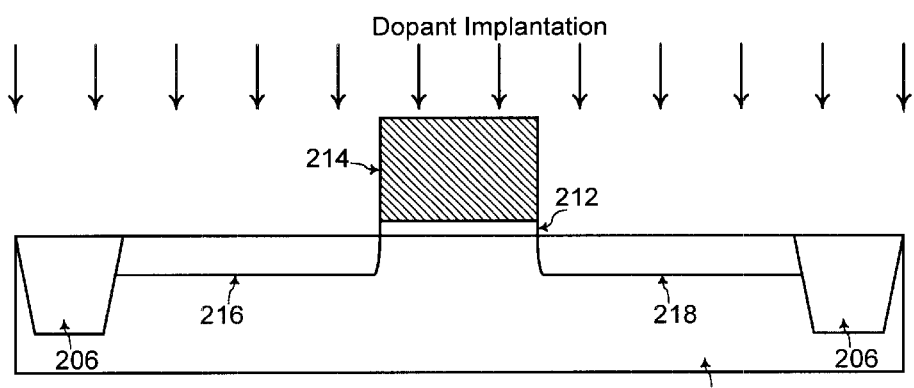

Referring to FIG. 8, a bit line dopant is implanted into exposed regions of the active device area 202 of the semiconductor substrate 204 to form a drain bit line junction 216 to the left side of the dummy gate structure 214 and a source bit line junction 218 to the right side of the dummy gate structure 214. The bit line dopant is comprised of phosphorous or arsenic for an N-type dopant according to one embodiment of the present invention. After the implantation process, a thermal anneal is performed by heating up the semiconductor wafer 204 for activating the bit line dopant within the drain and source bit line junctions 216 and 218. Such implantation and thermal anneal processes for forming the drain and source bit line junctions 216 and 218 are known to one of ordinary skill in the art of integrated circuit fabrication and flash memory technology.

Figure 9:
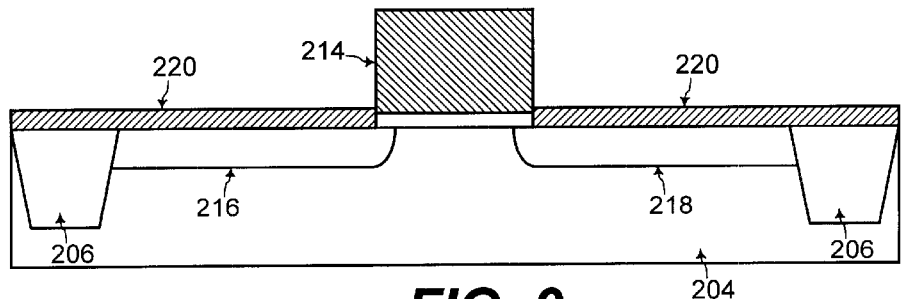
Figure 10:
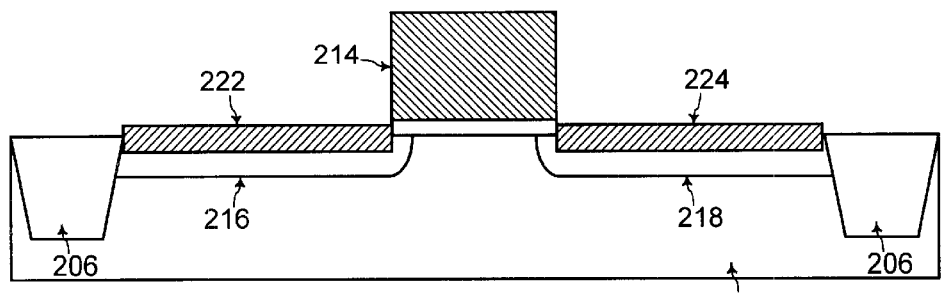

Referring to FIG. 9, a metal 220, such a nickel for example, is deposited on the drain and source bit line junctions 216 and 218. Referring to FIG. 10, a silicidation anneal is performed such that a drain bit line silicide 222 is formed with the metal 220 and the drain bit line junction 216 and such that a source bit line silicide 224 is formed with the metal 220 and the source bit line junction 218. After the silicidation anneal for forming the drain and source bit line suicides 222 and 224, any remaining metal 220 is etched away. Such processes, such as for the deposition of the metal 220, for the silicidation anneal, and for removal of the remaining metal 220 after the silicidation anneal, are known to one of ordinary skill in the art of integrated circuit fabrication and flash memory technology.

Figure 11:
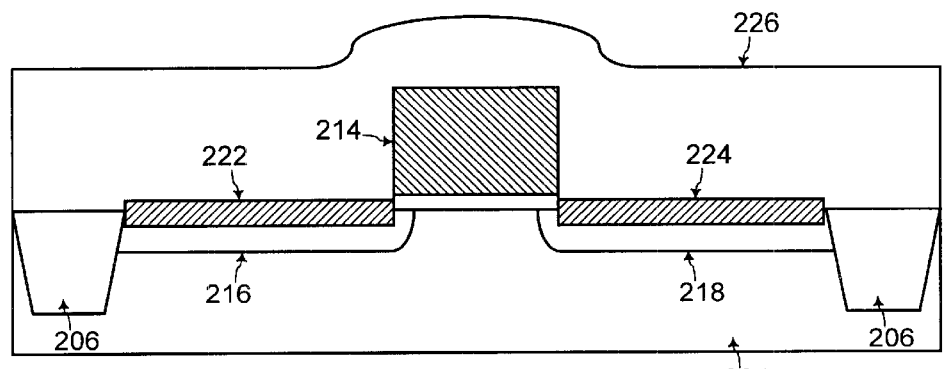
Figure 12:
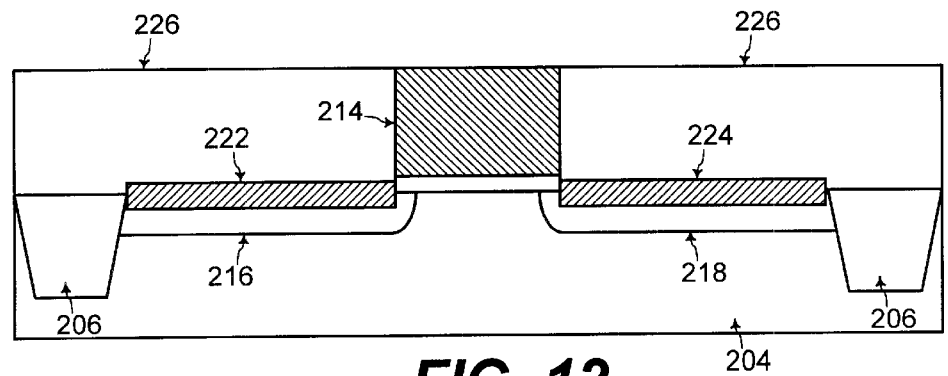

Referring to FIG. 11, after formation of the drain and source bit line silicides 222 and 224, an interlevel material 226 is conformally deposited. The interlevel material 226 is comprised of silicon dioxide ($SiO_2$) according to one embodiment of the present invention. Referring to FIG. 12, the interlevel material 226 is polished down until the top surface of the dummy gate structure 214 is exposed such that the dummy gate structure 214 is surrounded by the interlevel material 226. Processes for deposition of the interlevel material 226 and for polishing down the interlevel material 226, such as CMP (chemical mechanical polishing) processes, are known to one of ordinary skill in the art of integrated circuit fabrication and flash memory technology.

Figure 13:
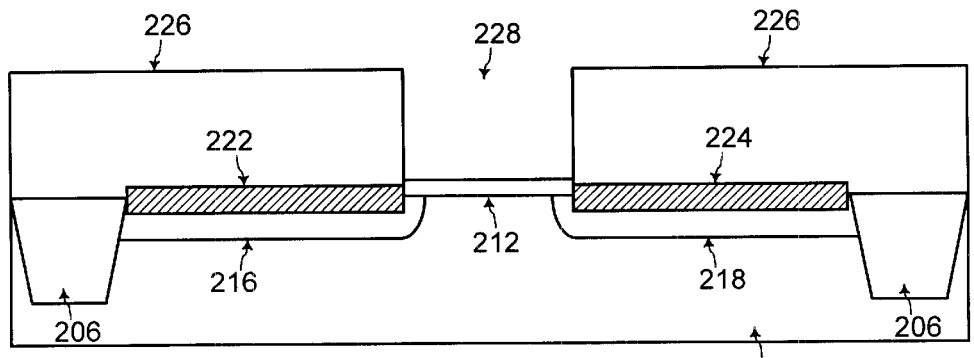

Referring to FIGS. 12 and 13, the dummy gate structure 214 is etched away to form a gate opening 228 surrounded by the interlevel material 226. Because the dummy gate structure 214 is comprised of silicon nitride (SiN), while the interlevel material 226 and the pad gate structure 212 are comprised of silicon dioxide ($SiO_2$), the dummy gate structure 214 is etched away in an etching process for selectively etching away the silicon nitride (SiN) of the dummy gate structure 214. Such a selective etching process for etching away the silicon nitride (SiN) of the dummy gate structure 214 is known to one of ordinary skill in the art of integrated circuit fabrication and flash memory technology.

Figure 14:
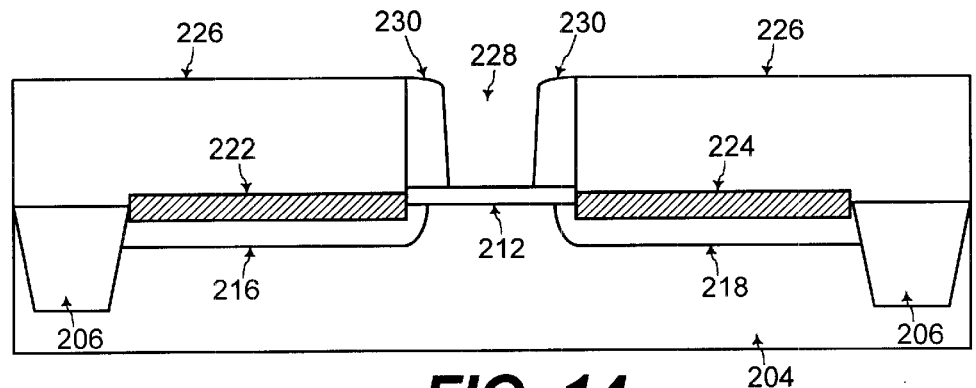

Referring to FIG. 14, after formation of the gate opening 228, spacers 230 are formed at sidewalls of the gate opening 228. The spacers 230 are comprised of silicon dioxide ($SiO_2$) according to one embodiment of the present invention. Processes for formation of the spacers 230 at the sidewalls of the gate opening 228 would be known to one of ordinary skill in the art of integrated circuit fabrication and flash memory technology.

Figure 15:
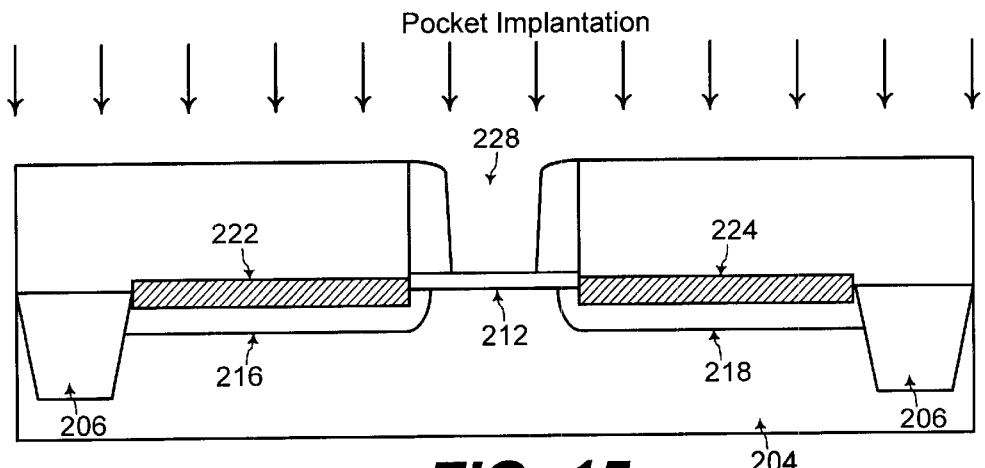

Referring to FIG. 15, an implantation process is performed for implanting a pocket dopant into the channel region of the flash memory cell within the semiconductor substrate 204 below the gate pad structure 212 and between the spacers 230. The pocket dopant has a conductivity type that is opposite to the conductivity type of the bit line dopant of the drain and source bit line junctions 216 and 218. For example, when the bit line dopant implanted for the drain and source bit line junctions 216 and 218 in FIG. 8 is N-type, the pocket dopant implanted in FIG. 15 is P-type. Implantation of such pocket dopant reduces undesired shortchannel effects of the flash memory cell, as known to one of ordinary skill in the art of integrated circuit fabrication and flash memory technology. Processes for implantation of such pocket dopant would be known to one of ordinary skill in the art of integrated circuit fabrication and flash memory technology.

Figure 16:
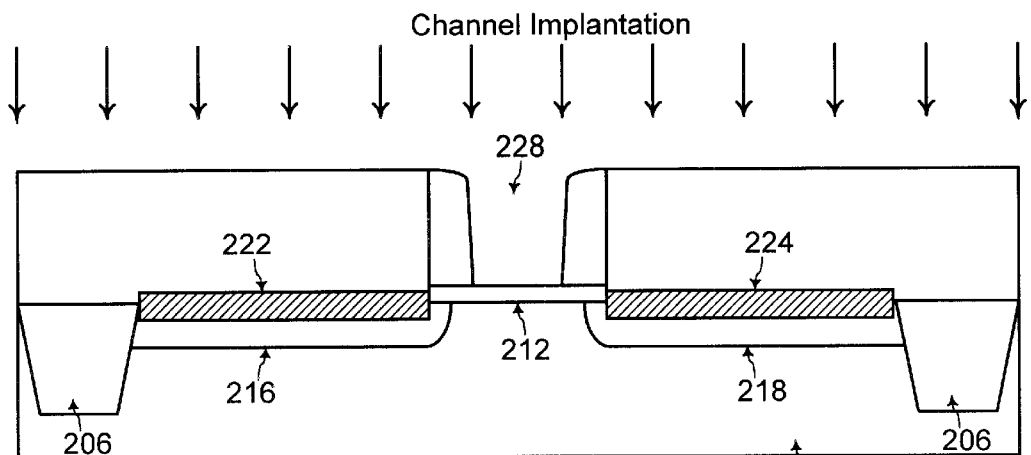

Referring to FIG. 16, an implantation process is performed for implanting a channel dopant into the channel region of the flash memory cell within the semiconductor substrate 204 below the gate pad structure 212 and between the spacers 230. The channel dopant is implanted into the channel region of the flash memory cell for adjusting the threshold voltage of the flash memory cell, as known to one of ordinary skill in the art of integrated circuit fabrication and flash memory technology. Processes for implantation of such channel dopant would be known to one of ordinary skill in the art of integrated circuit fabrication and flash memory technology.

Figure 17:
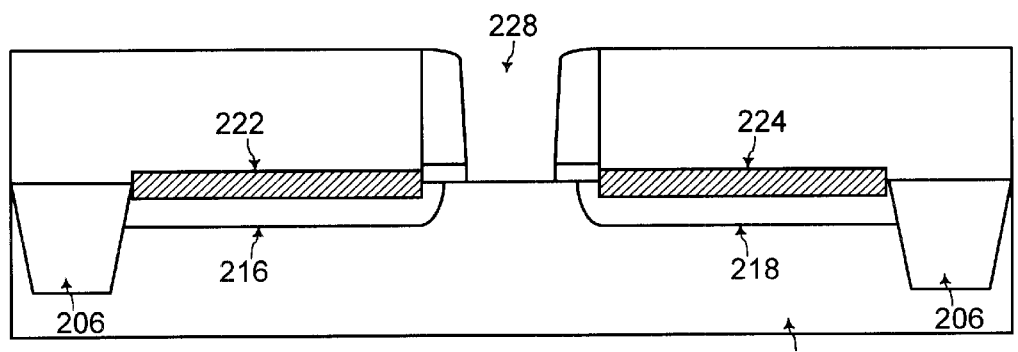

Referring to FIG. 17, the exposed portion of the pad gate structure 212 is etched away such that the semiconductor substrate 204 at the bottom wall of the gate opening 228 is exposed. Processes for etching away the exposed portion of the pad gate structure 212 comprised of silicon dioxide ($SiO_2$) for example, would be known to one of ordinary skill in the art of integrated circuit fabrication and flash memory technology.

Figure 18:
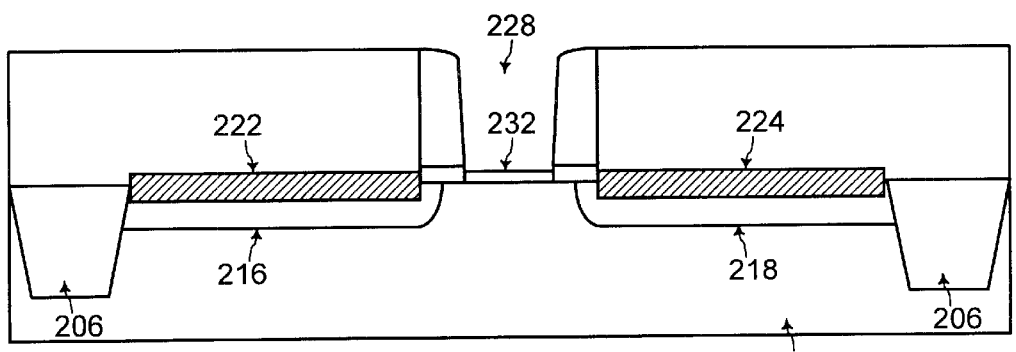

Referring to FIG. 18, a tunnel dielectric structure 232 is formed on the semiconductor substrate 204 at the bottom wall of the gate opening 228. The tunnel dielectric structure 232 is comprised of silicon dioxide ($SiO_2$) according to one embodiment of the present invention. Processes for formation of the tunnel dielectric structure 232 formed on the semiconductor substrate 204 at the bottom wall of the gate opening 228 would be known to one of ordinary skill in the art of integrated circuit fabrication and flash memory technology.

Figure 1:
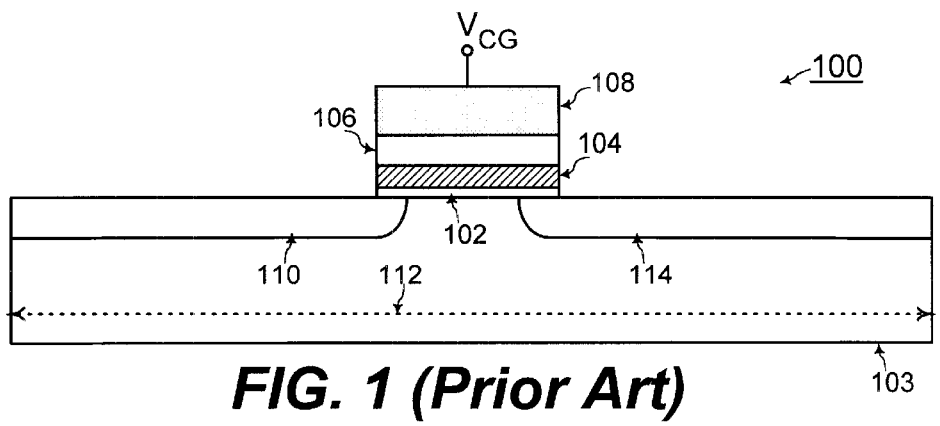
FIG. 1 shows a cross-sectional view of a flash memory cell, as known in the prior art.
Figure 2:
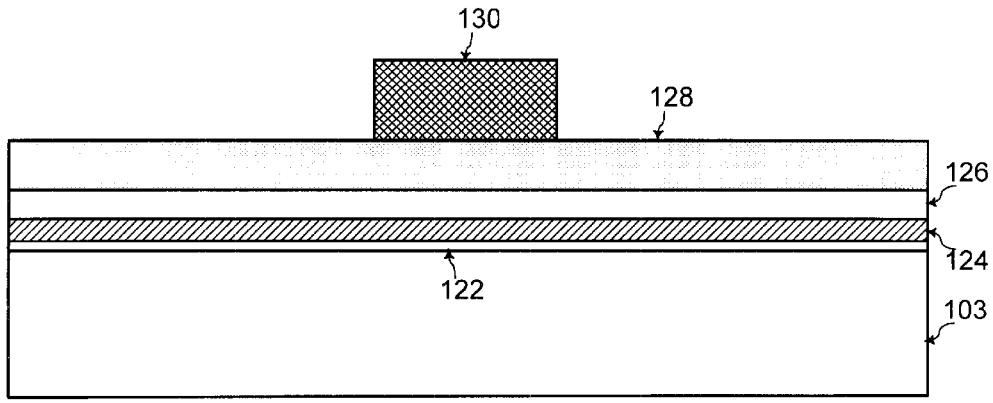
FIGS. 2, 3, 4, and 5 show cross-sectional views illustrating steps of fabrication of a flash memory cell with a channel length that is limited by photolithography limitations and with decreased area of drain and source bit line suicides from formation of spacers, according to the prior art.
Figure 3:
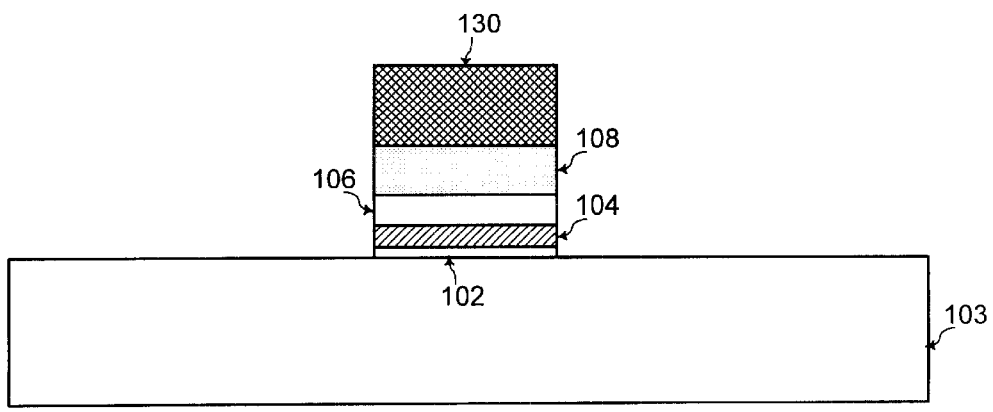
Figure 4:
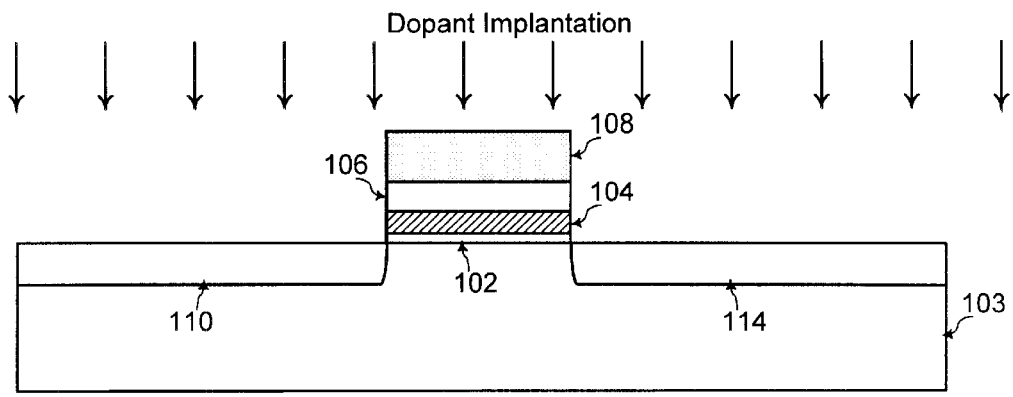
Figure 5:
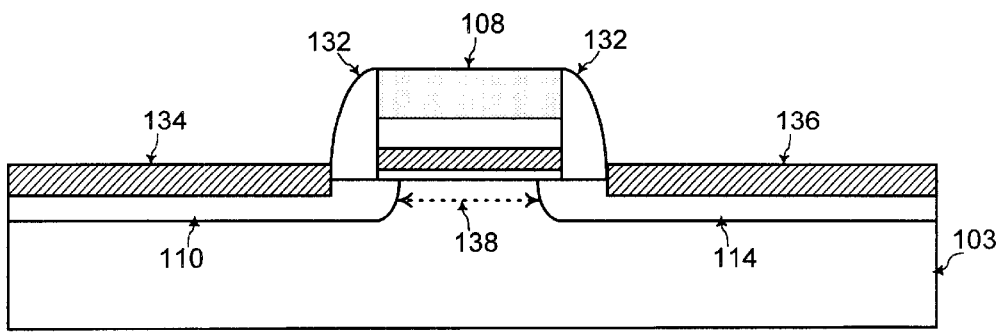
Figure 19:
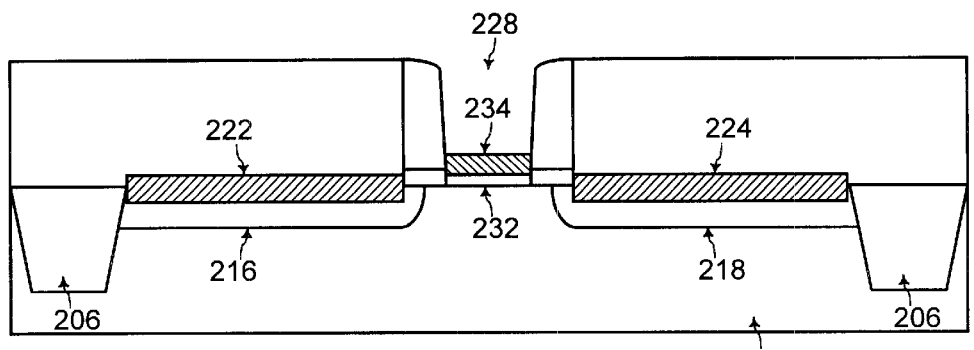

Referring to FIG. 19, a floating gate structure 234 is formed on the tunnel dielectric structure 232 within the gate opening 228. The floating gate structure 234 of FIG. 19 is similar to the floating gate structure 104 of FIG. 1 and stores charge for the flash memory cell. The floating gate structure 234 is comprised of one of polysilicon or silicon nitride (SiN), according to one embodiment of the present invention. Processes for formation of the floating gate structure 234 on the tunnel dielectric structure 232 within the gate opening 228 would be known to one of ordinary skill in the art of integrated circuit fabrication and flash memory technology.

Figure 20:
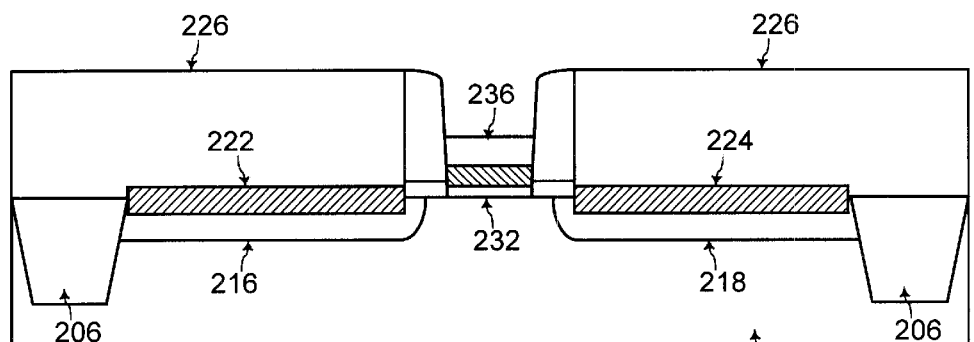

Referring to FIG. 20, a floating dielectric structure 236 is formed on the floating gate structure 234 within the gate opening 228. The floating dielectric structure 236 is comprised of silicon dioxide ($SiO_2$) according to one embodiment of the present invention. Processes for formation of the floating dielectric structure 236 on the floating gate structure 234 within the gate opening 228 would be known to one of ordinary skill in the art of integrated circuit fabrication and flash memory technology.

Figure 21:
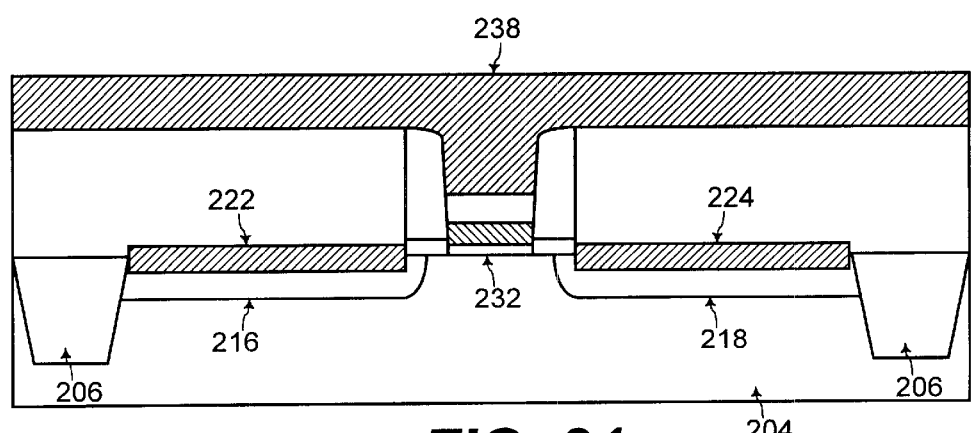

Referring to FIGS. 20 and 21, a control gate material 238 is conformally deposited to fill the gate opening 228 and on the interlevel material 226. The control gate material 238 is comprised of polysilicon according to one embodiment of the present invention. Processes for conformally depositing such control gate material 238 to fill the gate opening 228 and on the interlevel material 226 are known to one of ordinary skill in the art of integrated circuit fabrication and flash memory technology.

Figure 22:
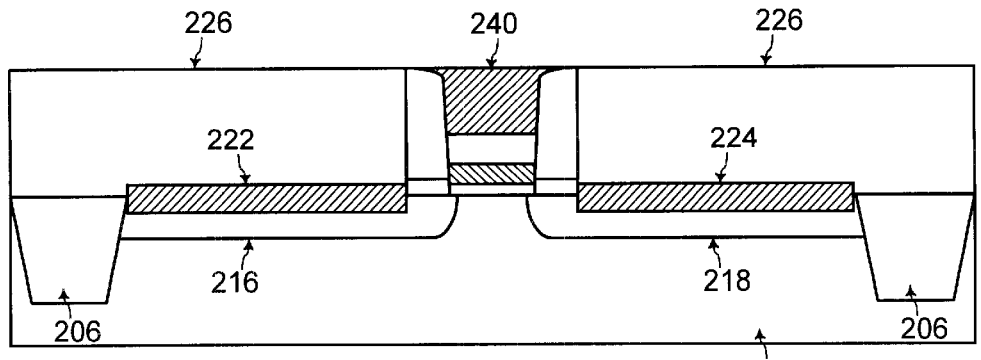

Referring to FIGS. 21 and 22, the control gate material 238 is polished down until the interlevel material 226 is exposed such that the control gate material 238 is contained within the gate opening 228 to form a control gate structure 240 within the gate opening 228. Polishing processes such as CMP (chemical mechanical polishing) processes for polishing down the control gate material 238, comprised of polysilicon for example, are known to one of ordinary skill in the art of integrated circuit fabrication and flash memory technology.

Figure 23:
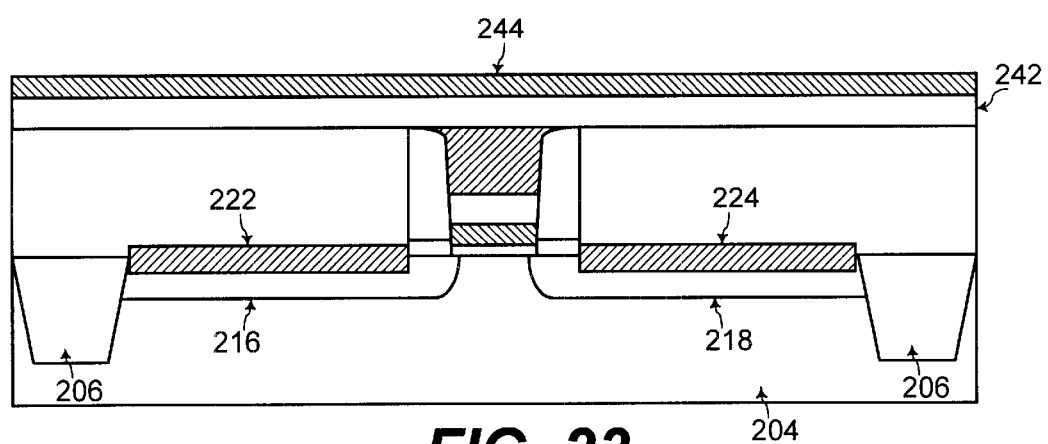

Referring to FIGS. 22 and 23, encapsulating layers of dielectric materials 242 and 244 are deposited to encapsulate the control gate structure 240, the floating dielectric structure 236, the floating gate structure 234, and the tunnel dielectric structure 232 within the gate opening 228. The dielectric materials 242 and 244 are comprised of silicon dioxide ($SiO_2$) and silicon nitride (SiN), respectively, according to one embodiment of the present invention. However, a layer of encapsulating dielectric material comprised of any combination of at least one of silicon dioxide ($SiO_2$) and/or silicon nitride (SiN) may be deposited to encapsulate the control gate structure 240, the floating dielectric structure 236, the floating gate structure 234, and the tunnel dielectric structure 232 within the gate opening 228. Processes for deposition of the layers of encapsulating dielectric materials 242 and 244 are known to one of ordinary skill in the art of integrated circuit fabrication and flash memory technology.

During later fabrication processes, $H_2$ gas may be generated. When $H_2$ diffuses into any one of the control gate structure 240, the floating dielectric structure 236, the floating gate structure 234, or the tunnel dielectric structure 232 comprised of nitrogen, the threshold voltage of the flash memory cell may be undesirably changed. The layers of encapsulating dielectric materials 242 and 244 prevent such deleterious penetration of $H_2$ into the control gate structure 240, the floating dielectric structure 236, the floating gate structure 234, or the tunnel dielectric structure 232.

Figure 24:
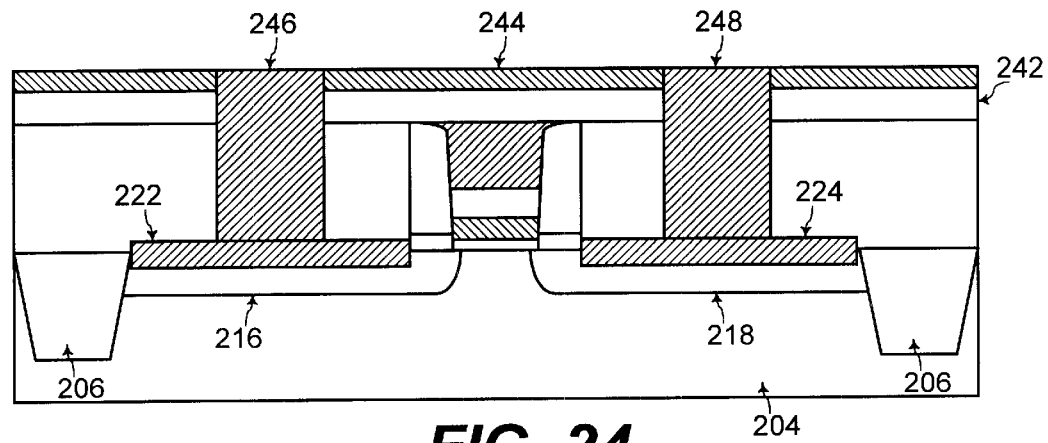

Referring to FIGS. 23 and 24, a drain bit line interconnect 246 is formed through the layers of encapsulating dielectric materials 242 and 244 and the interlevel material 226 for electrical connection to the drain bit line silicide 222. Similarly, a source bit line interconnect 248 is formed through the layers of encapsulating dielectric materials 242 and 244 and the interlevel material 226 for electrical connection to the source bit line silicide 224. Processes for formation of such drain and source bit line interconnects 246 and 248 are known to one of ordinary skill in the art of integrated circuit fabrication and flash memory technology. In FIG. 24, note that the drain and source bit line junctions 216 and 218 have diffused inward toward the channel from thermal anneal processes to overlap under the tunnel dielectric structure 232 for proper operation of the flash memory cell.

In this manner, a self-aligned gate structure is formed to be comprised of the tunnel dielectric structure 232, the floating gate structure 234, the floating dielectric structure 236, and the control gate structure 240 between the spacers 230 within the gate opening 228. Additionally, because the drain and source bit line silicides 222 and 224 are formed in FIG. 10 before formation of the spacers 230 in FIG. 14, the area of the drain and source bit line silicides 222 and 224 is not limited by formation of the spacers 230 to maximize the area of the drain and source bit line silicides 222 and 224.

In addition, because the spacers 230 are formed before formation of the self-aligned gate structure, the channel length of the flash memory cell defined by the length of the self-aligned gate structure is further decreased by the width of the spacers 230 such that the channel length of the flash memory cell may be reduced beyond that possible from photolithography limitations. Furthermore, because the drain and source bit line junctions 216 and 218 are formed with the dummy gate structure 214 that has a longer length than the length of the self-aligned gate structure, the distance between the drain and source bit line junctions 216 and 218 is maximized to minimize the leakage current between the drain bit line junction and the source bit line junction 216 and 218.

The foregoing is by way of example only and is not intended to be limiting. For example, the present invention may be practiced with other types of materials than described herein for example embodiments of the present invention. Any materials described herein are by way of example only. Additionally, as will be understood by those skilled in the art, the structures described herein may be made or used in the same way regardless of their position and orientation. Accordingly, it is to be understood that terms and phrases such as "top," "bottom," "on," and "side" as used herein refer to relative location and orientation of various portions of the structures with respect to one another, and are not intended to suggest that any particular absolute orientation with respect to external objects is necessary or required. The present invention is limited only as defined in the following claims and equivalents thereof.

I claim:

1. A method for fabricating a flash memory cell, the method including the steps of:

A. forming a dummy gate structure on an active device area of a semiconductor substrate;

B. forming a drain bit line junction within said active device area of said semiconductor substrate to a first side of said dummy gate structure, and forming a source bit line junction within said active device area of said semiconductor substrate to a second side of said dummy gate structure;

C. forming a drain bit line silicide within said drain bit line junction and forming a source bit line silicide within said source bit line junction;

D. forming an interlevel material to surround said dummy gate structure;

E. etching away said dummy gate structure to form a gate opening within said interlevel material, after said steps B and C;

F. forming spacers at sidewalls of said gate opening within said gate opening;

G. forming a tunnel dielectric structure at a bottom wall of said gate opening, after said step F;

H. forming a floating gate structure on said tunnel dielectric structure within said gate opening, after said step G;

I. forming a floating dielectric structure on said floating gate structure within said gate opening, after said step H; and J. forming a control gate structure on said floating dielectric structure within said gate opening, after said step I.

2. The method of claim 1, further including the steps of:
forming a pad gate structure on said semiconductor substrate below said dummy gate structure in said step A; and
etching away any exposed portion of said pad gate structure after said step F and before said step G such that said tunnel dielectric structure is formed on said semiconductor substrate in said step G.

3. The method of claim 2, wherein said semiconductor substrate is comprised of silicon, wherein said pad gate structure is comprised of silicon dioxide ($SiO_2$), and wherein said dummy gate structure is comprised of silicon nitride (SiN).

4. The method of claim 1, wherein said step B includes the steps of:
implanting a bit line dopant into exposed portions of said active device area of said semiconductor substrate to form said drain and source bit line junctions; and
performing a thermal anneal to activate said bit line dopant within said drain and source bit line junctions.

5. The method of claim 4, wherein said bit line dopant is an N-type dopant.

6. The method of claim 1, wherein said step C includes the steps of:
depositing a metal on said drain and source bit line junctions; and
performing a silicidation anneal to form said drain and source bit line silicides from said metal on said drain and source bit line junctions.

7. The method of claim 1, wherein said dummy gate structure is comprised of silicon nitride (SiN), and wherein said interlevel material is a dielectric material comprised of silicon dioxide ($SiO_2$).

8. The method of claim 7, further including the steps of:
conformally depositing said interlevel material comprised of silicon dioxide ($SiO_2$) to surround said dummy gate structure; and
polishing down said interlevel material until said dummy gate structure is exposed and contained within said interlevel material.

9. The method of claim 7, wherein said dummy gate structure comprised of silicon nitride (SiN) is selectively etched away in said step E with said silicon dioxide ($SiO_2$) of said interlevel material surrounding said gate opening.

10. The method of claim 7, wherein said spacers are comprised of silicon dioxide ($SiO_2$).

11. The method of claim 1, further including the steps of:
implanting a pocket dopant that is opposite in conductivity type to dopant of said drain and source bit line junctions after said step F and before said step G; and
implanting a channel dopant to adjust a threshold voltage of said flash memory cell after said step F and before said step G.

12. The method of claim 1, wherein said tunnel dielectric structure is comprised of silicon dioxide ($SiO_2$).

13. The method of claim 1, wherein said floating gate structure is comprised of silicon nitride (SiN) for charge storage within said flash memory cell.

14. The method of claim 1, wherein said floating gate structure is comprised of polysilicon for charge storage within said flash memory cell.

15. The method of claim 1, wherein said floating dielectric structure is comprised of silicon dioxide ($SiO_2$).

16. The method of claim 1, wherein said control gate structure is comprised of polysilicon.

17. The method of claim 16, wherein said step J includes the steps of:
conformally depositing polysilicon on said floating dielectric structure within said gate opening and on said interlevel material surrounding said gate opening; and
polishing away said polysilicon on said interlevel material such that said polysilicon is contained within said gate opening to form said control gate structure.

18. The method of claim 1, further including the step of:
forming an encapsulating layer of dielectric material to encapsulate said control gate structure within said gate opening to prevent $H_2$ penetration into said control gate structure, said floating dielectric structure, said floating gate structure, or tunnel dielectric structure.

19. The method of claim 18, wherein said layer of dielectric material is comprised of at least one of silicon dioxide ($SiO_2$) and silicon nitride (SiN).

20. The method of claim 1, further including the step of:
forming interconnect through said interlevel material to said drain and source bit line silicides.

21. A method for fabricating a flash memory cell, the method including the steps of:

A. forming a pad gate structure comprised of silicon dioxide ($SiO_2$) on an active device area of a semiconductor substrate comprised of silicon;

B. forming a dummy gate structure comprised of silicon nitride (SiN) on said pad gate structure;

C. implanting a bit line dopant that is an N-type dopant for forming a drain bit line junction within said active device area of said semiconductor substrate to a first side of said dummy gate structure, and for forming a source bit line junction within said active device area of said semiconductor substrate to a second side of said dummy gate structure;

D. performing a thermal anneal to activate said bit line dopant within said drain and source bit line junctions;

E. depositing a metal on said drain and source bit line junctions;

F. performing a silicidation anneal to form a drain bit line silicide from said metal with said drain bit line junction and to form a source bit line silicide from said metal with said source bit line junction;

G. conformally depositing an interlevel material comprised of silicon dioxide ($SiO_2$) to surround said dummy gate structure;

H. polishing down said interlevel material until said dummy gate structure is exposed and contained within said interlevel material;

I. etching away said dummy gate structure to form a gate opening within said interlevel material;

J. forming spacers comprised of silicon dioxide ($SiO_2$) at sidewalls of said gate opening within said gate opening;

K. implanting a pocket dopant that is opposite in conductivity type to said bit line dopant;

L. implanting a channel dopant to adjust a threshold voltage of said flash memory cell;

M. etching away any exposed portion of said pad gate structure at a bottom wall of said gate opening;

N. forming a tunnel dielectric structure comprised of silicon dioxide ($SiO_2$) on the semiconductor substrate at the bottom wall of said gate opening;

O. forming a floating gate structure comprised of one of silicon nitride (SiN) or polysilicon for charge storage within said flash memory cell, on said tunnel dielectric structure within said gate opening;

P. forming a floating dielectric structure comprised of silicon dioxide ($SiO_2$) on said floating gate structure within said gate opening;

Q. conformally depositing polysilicon on said floating dielectric structure within said gate opening and on said interlevel material surrounding said gate opening;

R. polishing away said polysilicon on said interlevel material such that said polysilicon is contained within said gate opening to form a control gate structure;

S. forming an encapsulating layer of dielectric material comprised of at least one of silicon dioxide ($SiO_2$) and silicon nitride (SiN) to encapsulate said control gate structure within said gate opening to prevent $H_2$ penetration into said control gate structure, said floating dielectric structure, said floating gate structure, or tunnel dielectric structure; and T. forming interconnect through said interlevel material to said drain and source bit line silicides.

\* \* \* \* \*